United States Patent [19]

Belfer et al.

[11] 4,258,348
[45] Mar. 24, 1981

[54] CURRENT MEASURING TRANSFORMER

[75] Inventors: Kenneth H. Belfer, Alamo; Arnold Stewart, San Leandro; Russell Tavare, Hayward, all of Calif.

[73] Assignee: STB Transformer Company, San Leandro, Calif.

[21] Appl. No.: 93,866

[22] Filed: Nov. 13, 1979

[51] Int. Cl.³ .................... H01F 27/28; H01F 27/26
[52] U.S. Cl. .................... 336/73; 336/105; 336/176; 336/217
[58] Field of Search .............. 336/175, 176, 212, 217, 336/105, 107, 73, 184, 69, 70; 324/127, 129, 117 R, 117 H

[56] References Cited
U.S. PATENT DOCUMENTS

| | | | |
|---|---|---|---|
| 1,365,569 | 1/1921 | Troy | 336/217 X |
| 1,555,066 | 9/1925 | Lines | 336/176 |
| 2,175,934 | 10/1939 | Wentz | 336/176 |
| 2,332,127 | 10/1943 | Annis | 336/176 X |
| 2,337,148 | 12/1943 | Barnes | 336/176 X |
| 3,573,692 | 4/1971 | Stetson | 336/107 |

*Primary Examiner*—Thomas J. Kozma
*Attorney, Agent, or Firm*—Harris Zimmerman; Howard Cohen

[57] ABSTRACT

A transformer for measuring current flowing through a conductor includes a U-shaped housing which is adapted to be received about the conductor. A closure member is secured by a sliding hinge assembly to one distal end of the housing, and is adapted to be latched between the distal ends. Within the housing a plurality a U-shaped core laminations are disposed in adjacent laminated groups. The closure member includes a plurality of laminated groups which are disposed to interleave with the distal ends of the U-shaped laminations to form a continuous magnetic circuit about the conductor. Equal secondary windings about the legs of the U-shaped laminations are connected in series to counteract any proximity effect of the conductor within the transformer.

7 Claims, 10 Drawing Figures

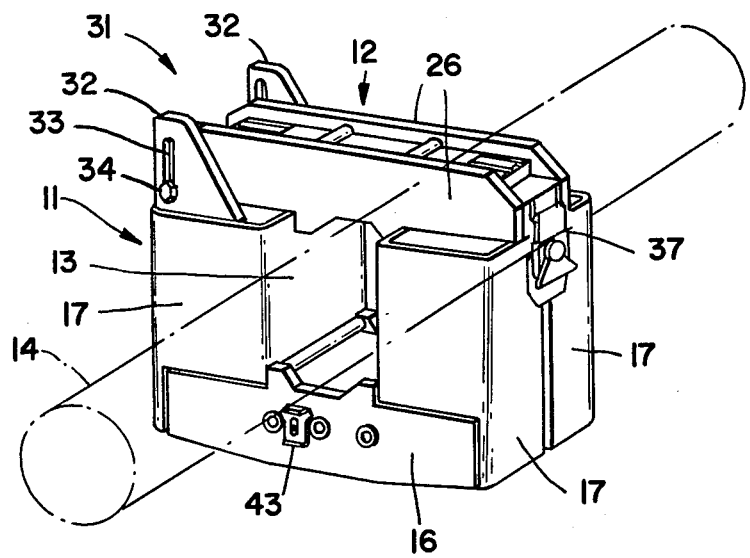
FIG_1
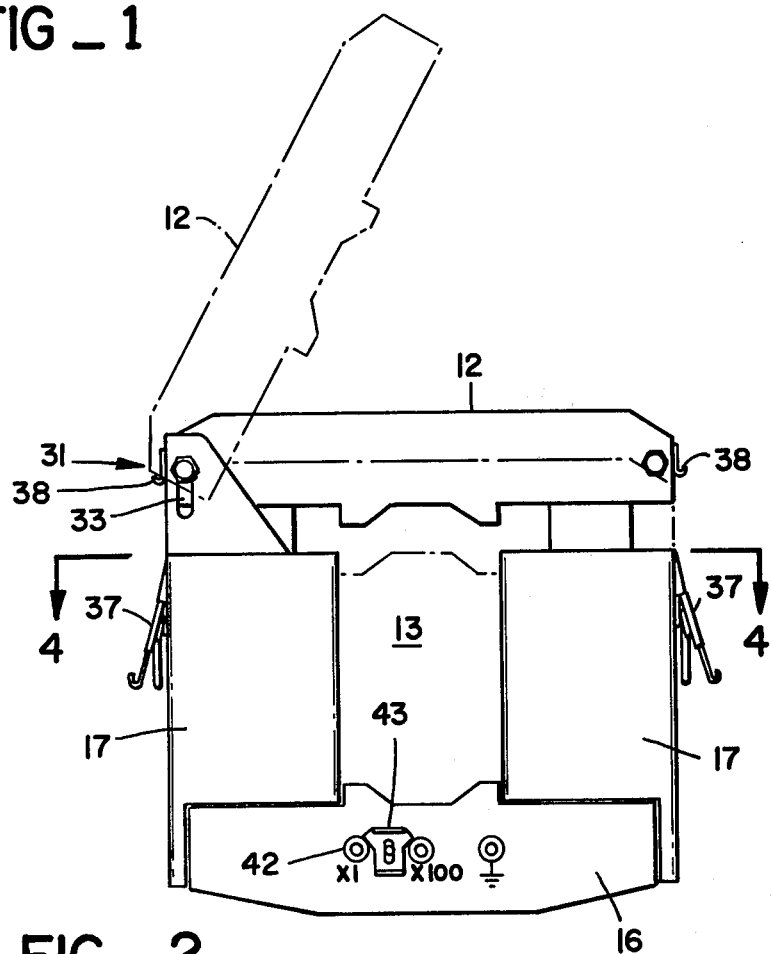
FIG_2

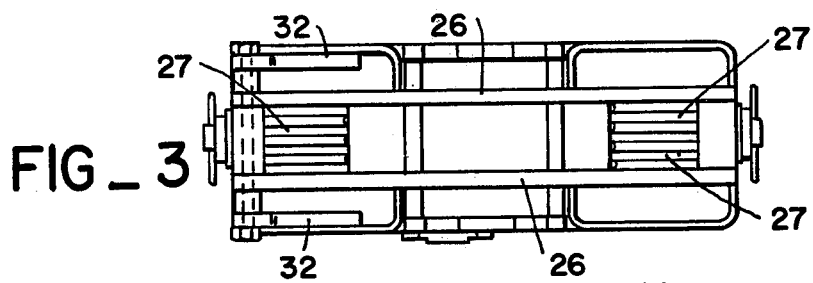
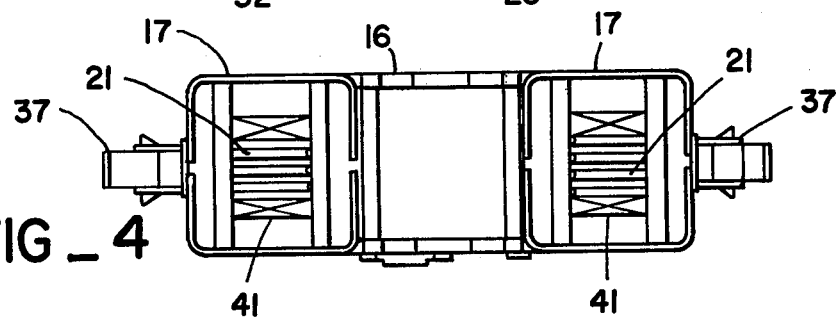
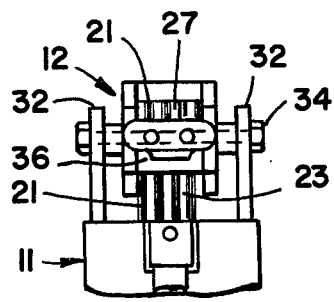
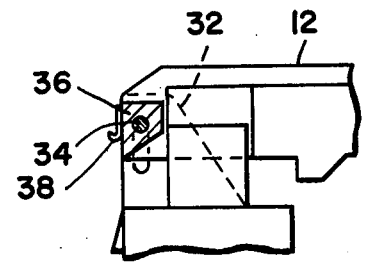
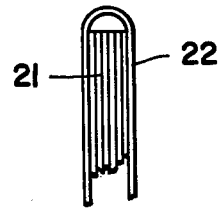
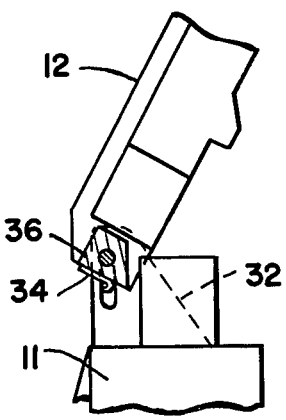
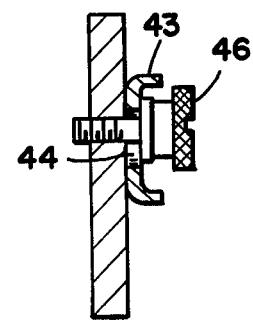
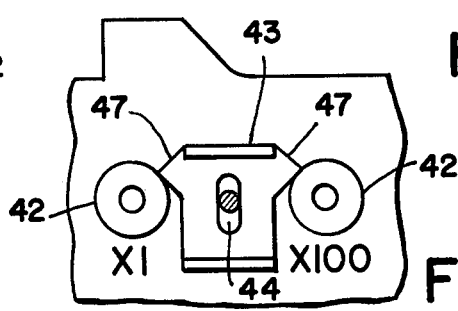

CURRENT MEASURING TRANSFORMER

BACKGROUND OF THE INVENTION

There are known in the prior art many devices for measuring electrical current flowing in a conductor. These devices generally provide a closed, magnetic flux conducting path about a portion of the conductor, and include secondary windings about the flux conducting path in which a voltage is induced by the inductive effect of the conductor on the flux conducting path. The flux conducting path often comprises a laminated core construction often employed in transformer designs.

The prior art current transformers described above all suffer from a source of error which is apparently inherent in the geometry of current transformers. That is, the current transformer must form a closed, flux conducting path about the conductor, yet it often must be portable and therefore removable from the conductor. To fashion the transformer so that it is removable from the conductor, the core laminations must be openable to admit and remove the conductor from within the closed loop core. Thus a portion of the core often is hinged, and is provided with a latch to releasably secure the hinged portion. However, it has been found that the degree to which the hinged portion is closed upon the remaining portion of the core has a pronounced influence on the inductive effect produced in the core by the conductor. If the junction of the hinged portion and the fixed portion of the core does not constantly provide the same flux conducting effect as the remainder of the core, the readings obtained by the instrument will contain a significant error.

Furthermore, the secondary windings about the core of a current transformer are subject to a large voltage surge when the hinged core element is first closed upon the fixed core element. This voltage surge is connected directly to the readout terminals of the current transformer, and comprises a danger to the instrument technician which is dangerous or lethal.

SUMMARY OF THE INVENTION

The present invention generally comprises a current transformer used to measure the current flowing through a conductor. The most salient features of the present invention are a core structure which provides a substantially constant and uniform flux path therethrough, as well as a shorting device to ground any voltage surges which might occur when the instrument is first secured about a conductor.

The current transformer includes a plurality of generally U-shaped core panels which are subdivided and jacketed in substantially equal groups. The core groups are laminated in adjacent fashion, and extend outwardly from the distal ends of the U-configuration in alternating fashion; i.e., every other jacketed group extends outwardly from the distal ends. A pair of secondary windings are wrapped about the legs of the U-shaped core portion, and are connected in series to cancel any proximity effect caused by the conductor being disposed closer to one of the legs of the core. The U-shaped core portion is enclosed in a housing formed of aluminum, machinable plastic, or the like.

Joined to the U-shaped housing and extending from one of the distal ends thereof is a sliding hinge assembly. Joined to the sliding hinge assembly is a closure member which includes a plurality of jacketed care groups identical to the U-shaped core portion. The distal ends of the closure member core portion extend outwardly in alternating fashion and are adapted to be interleaved with the jacketed core portions extending upwardly from the U-shaped core portion. The sliding hinge mechanism permits the closure member core portion to be translated directly toward the distal ends of the U-shaped core portion, rather than being pivotted into engagement as is known in the prior art. The pair of latch mechanisms pull the closure member toward the U-shaped portion to effect complete interleaving of the jacketed core laminations. Thus the flux path is constant throughout the closed loop of the core, so that no substantial errors are introduced thereby.

The secondary windings are connected to output terminals disposed on one face of the U-shaped housing portion. A contact member is slidably disposed between two of the output terminals, and includes laterally extending arms which contact and short the output terminals when the contact member is slid toward the terminals. Shorting of the output terminals alleviates the danger of voltage surges in the secondary windings which may occur when the closure member is first closed to complete the magnetic circuit about the conductor.

The sliding hinge mechanism also includes means to prevent the closure member from accidentally and abruptly pivotting shut from the fully opened position. This means includes a block secured about the hinge pin and extending longitudinally therealong, the block having a trapezoidal cross-section with the closure member in the open position, the oblique surface of the trapezoidal block impinges on the upwardly extending adjacent core laminations. The hinge pin is secured in opposed slots in parallel arms, so that the closure member may be translated rather than rotated into interleaved engagement with the U-shaped core portions.

A BRIEF DESCRIPTION OF THE DRAWING

FIG. 1 is a perspective view of the current transformer of the present invention.

FIG. 2 is a front elevation of the current transformer of the present invention.

FIG. 3 is a top view of the current transformer of the present invention.

FIG. 4 is a cross sectional view of the current transformer, taken along line 4—4 of FIG. 2.

FIG. 5 is an enlarged detailed side view of a core lamination of the current transformer.

FIG. 6 is an end view of the sliding hinge assembly of the current transformer.

FIG. 7 is an enlarged front cross sectional view of the hinge assembly shown in the open position.

FIG. 8 is an enlarged front cross sectional view of the hinge assembly, shown in the closed position.

FIG. 9 is an enlarged, detailed view of the shorting contact member of the present invention.

FIG. 10 is a top view of the shorting member shown in FIG. 9.

DESCRIPTION OF THE PREFERRED EMBODIMENT

The present invention generally comprises a current transformer for use in measuring the flow of current through a conductor without making any direct electrical connection to the conductor. As shown in FIGS. 1 and 2, the transformer includes a generally U-shaped housing assembly 11, and a closure member 12 extending across the distal ends of the U-shaped housing assembly. The U-shaped housing assembly defines a gap 13 through which a current carrying conductor 14 may be disposed so that the current in the conductor 14 may be measured.

The housing assembly 11 includes a pair of end plates 16 secured to opposed sides of the medial portion of the U configuration. The housing assembly also includes a quartet of housing members 17 which are assembled in confronting pairs to define the legs of the portion 11 of the transformer.

The transformer also includes a generally U-shaped, magnetic flux conducting core which is disposed within the housing assembly 11. The core includes a plurality of U-shaped ferrous panels which are arranged in laminated fashion in individual groups 21, as shown in FIGS. 3, 4 and 6. With reference to FIG. 5, each laminated group of panels 21 is enclosed in a ferrous metal jacket 22, the jacketed group being disposed in adjacent laminated fashion to form the core of the transformer. As shown in FIG. 6, every other one of the adjacent core groups 21 extends upwardly from the distal ends of the housing 11, thereby defining a plurality of gaps 23 between the groups of laminated core panels extending upwardly from the distal ends of the housing.

The closure member 12 includes a pair of parallel, spaced apart plates 26 which extend laterally and span the distal ends of the U-shaped housing assembly 11. Disposed between the plates 26 are a plurality of groups 21 of core panels, the width and thickness of the groups being identical of the U-shaped adjacent portion. A plurality of threaded fasteners extend between the plate 26 to join them compressively with the core groups 21 disposed therebetween.

At the distal ends of the laminations within the closure member 12, every other one of the groups of laminations extends outwardly therefrom to define therebetween like spaced gaps 27. As shown in FIG. 6, the gaps 27 are laterally spaced to receive the core groups 21 extending upwardly from the distal ends of the housing assembly 11, while the gaps 23 are disposed to receive the core groups extending outwardly from the distal ends in the closure member. Furthermore, the dimensions of the gaps 23 and 27 are substantially identical to the core groups that they receive, so that the core groups extending upwardly from the distal ends of the housing assembly 11 are completely interleaved with the core groups extending from the distal ends of the core assembly in the closure member 12. Thus the magnetic flux path throughout the transformer core remains constant, even at the juncture of the closure member with the U-shaped member.

A salient feature of the present invention is a sliding hinge assembly 31 which joins the closure member 12 to the U-shaped housing portion 11. The hinge assembly 31 includes a pair of parallel, spaced apart hinge plates 32 extending upwardly from one distal end of the housing assembly 11. Each hinge plate 32 includes a slot 33 extending therethrough parallel to the axis of the leg of the U-shaped configuration. A hinge pin 34 extends through the adjacent end of the closure member 12, and the opposed ends of the hinge pin extend through the slots 33, as shown in FIGS. 1, 2, and 6. There is sufficient clearance between the hinge pin 34 and the width of the slot 33 so that the hinge pin is freely rotatable or translatable within the slots.

The compound motion of the hinge assembly 31, including rotation and translation of the closure member 12 towards the distal ends of the housing 11, is provided to facilitate the proper interleaving and engagement of the core groups 21 of the closure member 12 with the core groups extending upwardly from the distal ends of the housing. In the prior art it is common practice to taper core laminations so that they will engage in the desired interleaved manner. However, tapering or otherwise altering the configuration of the core laminations results in a discontinuity in the flux path provided by the core, and this discontinuity introduces errors into the measurement of current passing through the conductor. However, in the present invention all of the core laminations are equal in all dimensions, and the distal ends which are to be interleaved are not tapered or otherwise modified in any way. Rather, the compound motion of the hinge assembly 31 accomplishes the proper interleaving of the core groups without requiring any modification of the core laminations themselves.

The hinge assembly 31 also includes a hinge block 36, as shown in FIGS. 6–8. The hinge block 36 is secured about the hinge pin 34 and is disposed within the confines of the hinge plate 32. The block 36 is provided with a trapezoidal configuration, the oblique side thereof facing the core groups 21 which extend from the end 11 of the housing when the closure member 12 is rotated upwardly about the hinge pin 34. The size of the hinge block 36 and the spacing of its facets from the extending laminations adjacent thereto is such that there is clearance between the block 36 and the lamination to permit rotation of the member 12 about the hinge pin 34 only when the hinge pin is disposed in the uppermost portions of the slots 33 in the hinge plates. It may be appreciated that other cross sectional configurations of the hinge block 36 may be fashioned to achieve the spacing of the block surface with respect to the angular disposition of the member 12 to achieve the purpose of permitting rotation of the member 12 toward the distal end only when the hinge pin is disposed in the distalmost portions of the slots 33.

The action of the hinge block 34 determines that the member 12 may be opened or closed only when the hinged end has first been translated outwardly so that the hinge pin 34 is disposed in the outermost portions of the slots 33. After the member 12 has pivotted so that the free end thereof engages the respective ends of the core groups 21, the member 12 must be translated toward the U-shaped portion of the transformer to effect total interleaving of the cooperatively engaging core element ends thereof. The invention includes a pair of latch mechanisms 37 disposed on opposite sides of the leg portions of the transformer. The latch mechanisms 37 may comprise any slide or lever arrangement known in the prior art which is capable of engaging the pair of detents 38 disposed at opposite ends of the closure member 12. The latch mechanisms 37 exert a pulling force on the detents 38 to cause the closure member 12 to translate toward the U-shaped portion of the transformer. As the member 12 is pulled downwardly toward the remainder of the transformer, the core elements become completely interleaved so that a continuous, uniform magnetic flux path is formed about the conductor disposed in the gap 13.

With reference to FIG. 4, the invention includes at least a pair of secondary coils 41, each of the windings wrapped about one of the legs of the U-shaped portion of the core. These windings are connected in series to eliminate any proximity effect created by the conductor in the gap 13 being disposed closer to one of the windings. A second pair of coils may be secured about the core in the same manner and location, the second pair having a number of windings which is a useful multiple of the number of windings in the first pair; i.e., the second pair of coils may have 100 times the windings of the first pair of coils. The use of two pairs of coils greatly extends the useful range of the current transformer.

The outputs of the pairs of coils are connected to output terminals 42, as shown in FIG. 2. These terminals may include an X1, X100, and ground terminal. A salient feature of the present invention is the provision of a shorting link 43 which is disposed between the X1 and X100 output terminals. The shorting link 43, as shown in FIG. 9, includes a longitudinally extending slot 44 through which a screw 46 extends to secure the shorting link to the transformer. The shorting link is slidably secured by the screw 46, although tightening of the screw will immobilize the link.

The shorting link 43 includes opposed, laterally extending arms 47 which are positioned to contact the adjacent terminals X1 and X100 when the link is translated downwardly. The shorting link 43 is positioned as shown in FIG. 9 prior to the closure of member 12, so that any voltage surges created in the windings by closure of the core flux path will be shorted. Thus the shorting link 43 neutralizes potentially dangerous or lethal voltage surges which normally occur when the transformer is first secured about a conductor.

We claim:

1. A transformer for measuring current flowing in a conductor, comprising a generally U-shaped housing, a generally U-shaped first core portion disposed in said housing, said first core portion defining a gap adapted to receive the conductor therethrough, a closure member extending across the distal ends of said housing, a second core portion disposed in said closure member and adapted to span the distal ends of said first core portion, said core portions comprising pluralities of magnetic flux-conducting panels disposed in adjacent, laminated groups, every other one of said laminated groups extending outwardly from the respective ends of said core portions and disposed so that the ends of said second core portion cooperatively engage and interleave with said distal ends of said first core portion, sliding hinge means for joining said closure member to said housing with a compound rotating-translating motion, said sliding hinge means including a pair of hinge plates extending outwardly from a distal end of said housing, a pair of slots disposed in aligned fashion in said hinge plates, and a hinge pin affixed to one end of said closure member and having end portions received in said slots in freely rotating and translating fashion, hinge block means secured to said closure member adjacent to said laminated groups extending from one of said distal ends of said first core portion, said hinge block means providing rotational clearance with said one of said ends only when said hinge pin is disposed in the distal-most portions of said slots, latch means for translating both ends of said closure member toward said housing to effect complete engagement and interleaving of said core portions, and coil means secured about one of said core portions to generate a voltage analog of the current induced in said core portions by the conductor.

2. The transformer of claim 1, further including output terminals connected to said coil means, and shorting link means slidably disposed adjacent to said output terminals and adapted to selectively impinge on and electrically short said terminals.

3. The transformer of claim 1, wherein said hinge block means includes a hinge block fixedly secured about said hinge pin.

4. The transformer of claim 3, wherein said hinge block is trapezoidal in cross-sectional configuration transverse to said hinge pin.

5. The transformer of claim 1, wherein said latch means includes a pair of latch assemblies secured to opposed legs of said housing.

6. The transformer of claim 5, further including a pair of detent members secured to opposite ends of said closure member and adapted to be engaged by said latch assemblies.

7. The transformer of claim 1, wherein said coil means includes a pair of coils secured about opposed legs of said core portions and electrically connected in series.

* * * * *